(12) United States Patent
Cao et al.

(10) Patent No.: US 7,271,647 B2
(45) Date of Patent: Sep. 18, 2007

(54) ACTIVE POLYPHASE FILTER

(75) Inventors: Kanyu Mark Cao, Cupertino, CA (US); Yiping Fan, Fremont, CA (US); Hongyu Li, Cupertino, CA (US); Chieh-Yuan Chao, Fremont, CA (US)

(73) Assignee: Mediatek, Inc., Hsin-Chu (TW)

( * ) Notice: Subject to any disclaimer, the term of this patent is extended or adjusted under 35 U.S.C. 154(b) by 180 days.

(21) Appl. No.: 11/209,914

(22) Filed: Aug. 22, 2005

(65) Prior Publication Data

US 2007/0040604 A1 Feb. 22, 2007

(51) Int. Cl.
*H03K 5/00* (2006.01)
*H04B 1/10* (2006.01)

(52) U.S. Cl. ...................... 327/552; 455/302
(58) Field of Classification Search ........ 327/552–559; 455/302, 307
See application file for complete search history.

(56) References Cited

U.S. PATENT DOCUMENTS

| | | | |
|---|---|---|---|
| 6,211,708 B1 * | 4/2001 | Klemmer | 327/122 |
| 6,226,509 B1 * | 5/2001 | Mole et al. | 455/302 |
| 6,636,085 B2 * | 10/2003 | Okazaki et al. | 327/101 |
| 6,750,715 B2 * | 6/2004 | Allott et al. | 330/258 |
| 6,831,497 B2 * | 12/2004 | Koh et al. | 327/254 |
| 6,993,310 B2 * | 1/2006 | Magnusen et al. | 455/302 |

* cited by examiner

*Primary Examiner*—Dinh T. Le
(74) *Attorney, Agent, or Firm*—Thomas, Kayden, Horstemeyer & Risley

(57) ABSTRACT

The present invention provides methods and apparatuses for a polyphase filter, comprising: a first and second cascoded differential amplifiers configured to receive a first and second differential signals, the first cascoded differential amplifier having a first resistor coupled between current legs of the first cascoded differential amplifier and the second cascoded differential amplifier having a first capacitor coupled between current legs of the second cascoded differential amplifier; and a third and fourth cascoded differential amplifiers configured to receive said first and said second differential signals, the third cascoded differential amplifier having a second resistor coupled between current legs of the third cascoded differential amplifier and the fourth cascoded differential amplifier having a second capacitor coupled between current legs of the fourth cascoded differential amplifier; wherein the first and second cascoded differential amplifiers are configured to provide a first differential output in response to the first and second differential signals and the third and fourth cascoded differential amplifiers are configured to provide a second differential output in response to the first and second differential signals.

16 Claims, 3 Drawing Sheets

US 7,271,647 B2

ACTIVE POLYPHASE FILTER

FIELD

The present invention relates to polyphase filters and, more particularly, to methods and apparatuses for active polyphase filter buffer circuits.

BACKGROUND

Polyphase filters receive an N-phase or polyphase input signal and create an N-phase output signal. Quadrature filters, a particular type of polyphase filters, are well-known four-phase polyphase filters. Generally speaking, the inputs of a quadrature filter consist of four signal voltages of mutually equal value. The four signal voltages jointly constitutes a signal vector group with individual signal vectors succeeding one another in a given direction of rotation through phase angles of 90 degrees. The frequency of the polyphase signal may be positive or negative depending on a counter-clockwise or clockwise rotation. Typically, the 0 degree and 180 degree signal vectors are designated the +I and −I signals, and the 90 degree and 270 degree signal vectors are designated the +jQ and −jQ signals.

Polyphase filters are widely used in high frequency clock data paths to generate quadrature signals and enhance image rejection of a clock signal. Initially, many polyphase filters were designed using a combination of LC filters. Today, with the prevalence of integrated circuits and difficulties of incorporating inductors into integrated circuits, a combination of RC filters are commonly used in polyphase filters. Most polyphase filters in use are passive circuits. A characteristic of passive circuits is that it will induce an energy loss that in general is proportional to the number of stages. Consequently, extra buffers are often used at the outputs of the passive polyphase filters which add cost and complexity to a circuit design.

FIG. 1 is an example of a prior art single stage polyphase filter 10. The single stage polyphase filter 10 is composed of a plurality of passive capacitors and resistors. Input $I_{in}^-$ 102 is coupled to a positive node of C4 104 and a first side of R3 106. Output $I_{out}^-$ 108 is coupled to the other side of R3 106 and a negative node of C3 110. Input $Q_{in}^+$ 112 is coupled to a positive node of C3 110 and a first side of R2 114. Output $Q_{out}^+$ 116 is coupled to the other side of R2 114 and a negative node of C2 118. Input $I_{in}^+$ 120 is coupled to a positive node of C2 118 and a first side R1 122. Output $I_{out}^+$ 124 is coupled to the other side of R1 122 and a negative node of C1 126. Output $Q_{out}^-$ 128 is coupled to a first side of R4 130 and the negative node of C4 104. Input $Q_{in}^-$ 132 is coupled to a positive node of C1 126 and the other side of R4 130. The single stage polyphase filter 10 includes inputs $I_{in}^-$ 102, $I_{in}^+$ 120, $Q_{in}^-$ 132, and $Q_{in}^+$ 112. Outputs of the s polyphase filter 10 include $I_{out}^-$ 108, $I_{out}^+$ 124, $Q_{out}^-$ 128, and $Q_{out}^+$ 116. The inputs and four outputs and is commonly known as a quadrature filter. Since the single stage polyphase filter 10 includes only a plurality of passive components, the filter undesirably attenuates the signals at the outputs. Moreover, as more stages are added, the energy loss is proportional to the number of stages added to the filter.

Efforts to overcome the undesirable passive characteristic of polyphase filters have included the use operational amplifiers to provide active RC filters. Incorporating operational amplifiers have afforded polyphase filters with some gain at the filter output. Moreover, feedback loops between the inputs and outputs of the active RC filter reduce sensitivity to component variations in integrated circuits. However, a major drawback of operational amplifier based polyphase filters is the limited bandwidth which limit operation to low frequencies.

Particularly with the advent of high frequency signals above the range of 1 gigahertz, operational amplifier based polyphase filters do not have the frequency response. Concededly, circuit designers have been limited to using passive polyphase filter designs in high frequency applications. Even though the passive polyphase filter designs heavily attenuate signals and require extra buffers with large gain, circuit designers have had little choice but to add the extra components to compensate for the signal loss of the passive polyphase filter designs.

Accordingly, what is needed is a method and apparatus that combines the advantageous characteristics of passive polyphase filters and active RC filters. The improved polyphase filter should include features such as ease of manufacturing using existing integrated circuit manufacturing processes, being able to operate in the gigahertz range, and be an active circuit with gain to reduce buffering requirements.

SUMMARY OF THE INVENTION

The present invention discloses methods and apparatuses for active polyphase filters. The active polyphase is based on cascode differential amplifiers and RC devices between the legs of the cascode differential amplifiers. Accordingly, an embodiment of the present invention discloses an active polyphase filter. The polyphase filter comprises a first set of two cascoded differential amplifiers configured to receive a first differential signal, a first cascoded differential amplifier having a first resistor coupled between current legs of the first cascoded differential amplifier and a second cascoded differential amplifier having a first capacitor coupled between current legs of the second cascoded differential amplifier, and a second set of two cascoded differential amplifiers configured to receive a second differential signal, a third cascoded differential amplifier having a second resistor coupled between current legs of the third cascoded differential amplifier and a fourth cascoded differential amplifier having a second capacitor coupled between current legs of the fourth cascoded differential amplifier wherein the second set of the two cascoded differential amplifiers are configured to provide a first differential output in response to the first differential signal and the first set of the two cascoded differential amplifiers are configured to provide a second differential output in response to the second differential signal.

In accordance with another aspect of the present invention, the first resistor is substantially equal to the second resistor and the first capacitor is substantially equal to the second capacitor. Matching the resistors and the capacitors optimizes operation of the polyphase filter.

In accordance with another aspect of the present invention, the first cascoded differential amplifier includes a first pair of load resistances coupled to a supply voltage.

In accordance to another embodiment of the present invention, the third cascoded differential amplifier includes a second pair of load resistances coupled to a supply voltage.

In accordance with yet another aspect of the present invention, the first pair of load resistances and the second pair of load resistances are substantially equal. Having substantially equal load resistance simplifies fabrication of the circuit and optimizes operation of the polyphase filter.

In accordance with yet another aspect of the present invention, each of the cascoded differential amplifiers includes transistors having substantially similar properties.

In accordance with another aspect of the present invention, the transistors include MOS devices having similar transconductance.

In accordance with another aspect of the present invention, the transistors include bipolar junction devices having substantially similar gm properties. The transistors of the cascode differential amplifiers afford the polyphase filter to produce a gain at the outputs. Producing a gain at the outputs eliminates the requirement for buffer circuits in most cases that will simplify circuit designs and reduce costs.

Other aspects and advantages of the present invention will become apparent to those skilled in the art from reading the following detailed description when taken in conjunction with the accompanying drawings.

DETAILED DESCRIPTION

As disclosed below, the present invention provides methods and apparatuses for an active polyphase filter. In general, the active polyphase filter is composed of high-speed amplifiers with phase operations. The high-speed amplifiers include differential pairs with input signals being passed to the load with a phase shift of 90 degrees through a capacitor. Additionally, the output of the high-speed amplifiers provides buffering characteristics with large gain. Since the high-speed amplifiers use differential pairs, the amplifiers maintain functionality at high frequency.

Throughout the description and the claims, the terms polyphase filter and quadrature filter may be used interchangeably. Quadrature filter is a special instance of a polyphase filter. Those skilled in the art will readily appreciate that the present implementation of a quadrature filter applies to polyphase filters. Accordingly, references to a quadrature filter are applicable to polyphase filter applications.

One application of a quadrature filter is the generation of quadrature signals from non-ideal vectors. As non-ideal vector inputs $I_{in}^+$, $I_{in}^-$, $Q_{in}^+$, and $Q_{in}^-$ are fed into quadrature filter, the filter provides outputs $I_{out}^+$, $I_{out}^-$, $Q_{out}^+$, and $Q_{out}^-$. Signals relative phases of 0° and 180° are I-signal or in-phase signal, and signals having relative phases of 90° and 270° are Q-signal or quadrature-phase signal. The outputs $I_{out}^+$, $I_{out}^-$, $Q_{out}^+$, and $Q_{out}^-$ are often referred to as filtered vectors and represent the differential quadrature signals having same amplitude and phase difference of 90° compared with the input. Consider the differential signals of the I vector and the Q vector of any given quadrature signal, each vector can be decomposed into two vectors, $I_1$ and $I_2$ for vector I and $Q_1$ and $Q_2$ for vector Q. Mathematically, it is possible to perform a decomposition with strictly perpendicular $(I_1,Q_1)$ and $(I_2,Q_2)$ vector pairs with equal amplitude, where $I_1$ leads $Q_1$ by 90 degrees and $Q_2$ leads $I_2$ by 90 degrees. In many circuit applications, only one sub-vector is desired. By convention, it is usually the set with $I_1$ leads $Q_1$. Accordingly, the magnitude ratio of desired vector set $(I_1,$ $Q_1)$ to the magnitude of the undesired set $(I_2, Q_2)$ is defined as image rejection ratio (IRR). The quadrature filter of the present improves the IRR of an input quadrature signal by providing different gains for the two vector sets.

Figure 1:
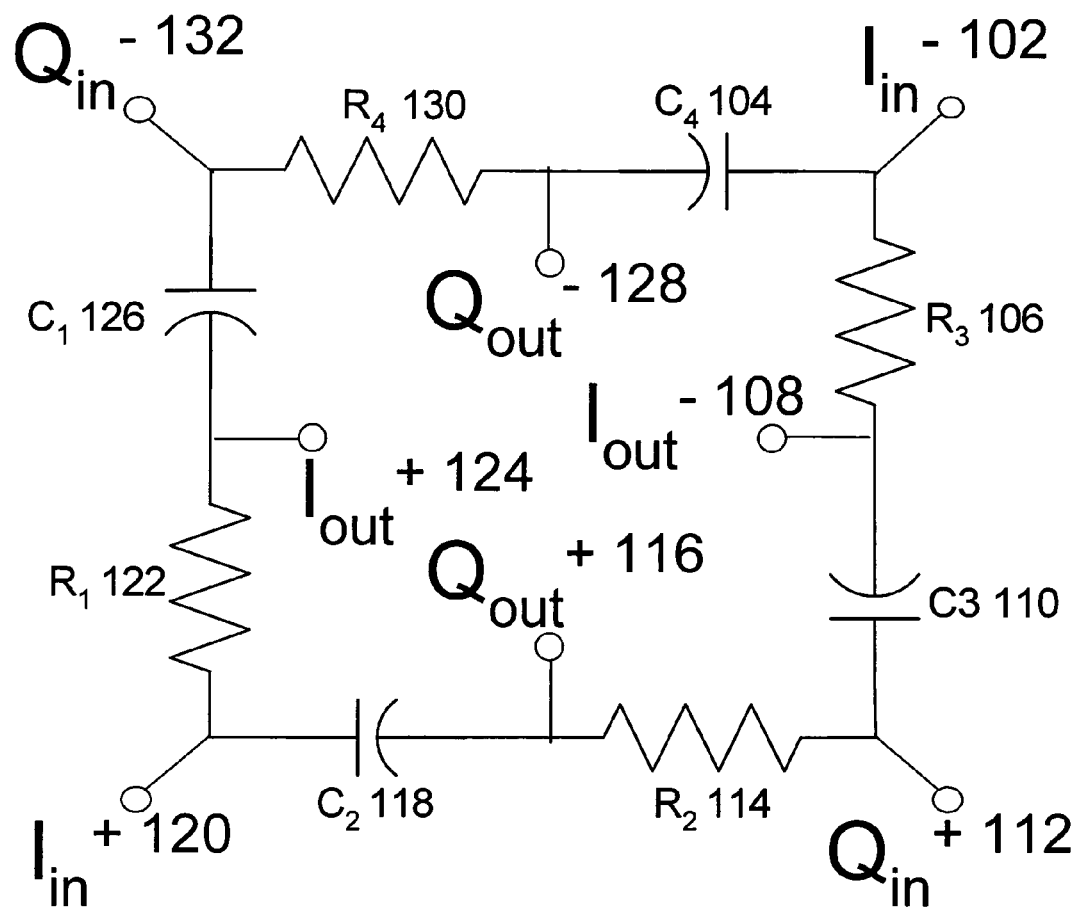
FIG. 1 illustrates a prior art polyphase filter.
Figure 2:
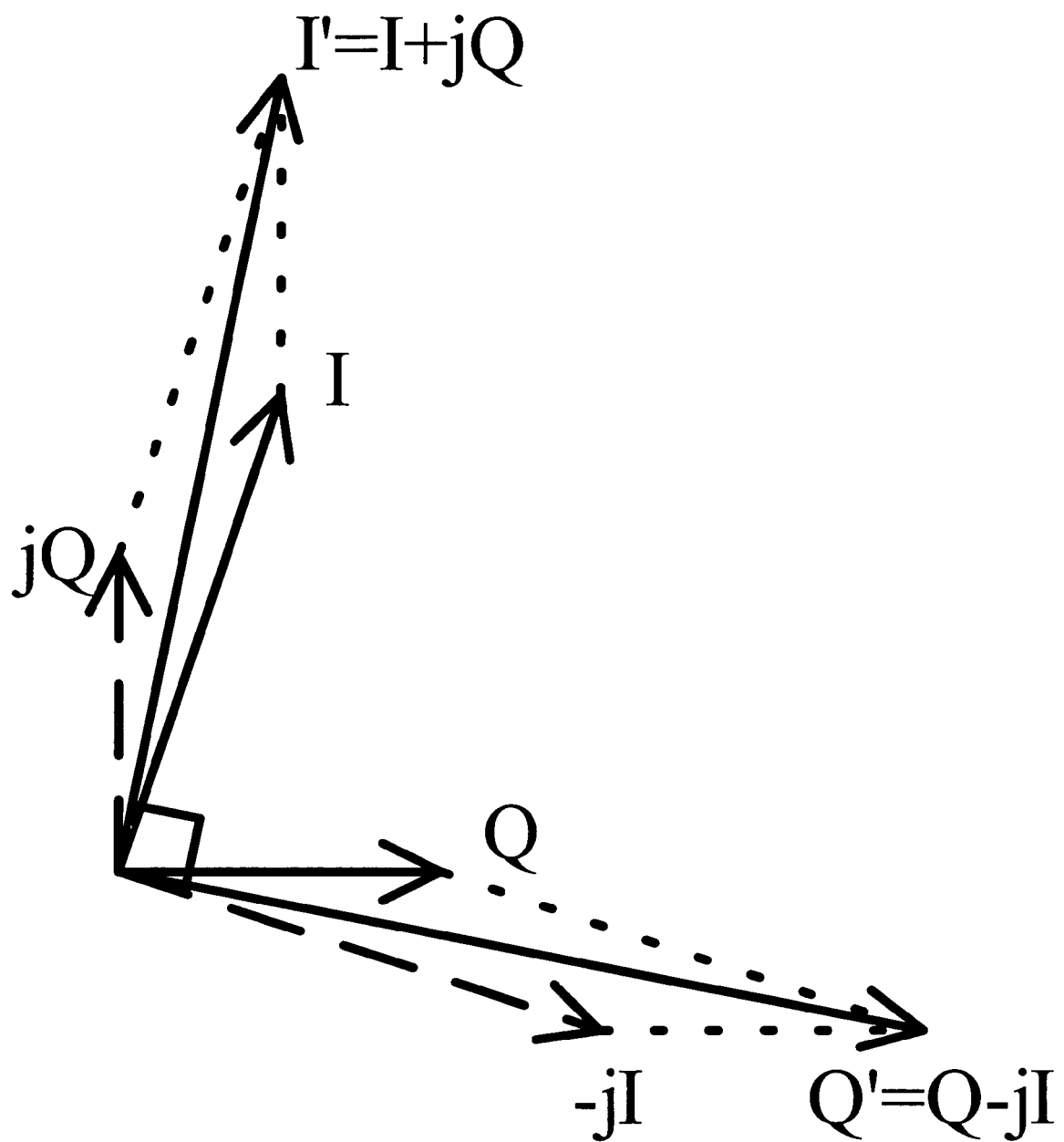
FIG. 2 illustrates generation of quadrature signal from non-ideal vectors.

FIG. 2 illustrates a graphical example of an application of a polyphase filter. The non-ideal vector outputs are rotated and summed to provide the generation of the quadrature signals where I'=I+jQ and Q'=Q−jI. The I' vector leads Q' vector by exactly 90 degrees in the new vector set. The magnitude of I' equals the magnitude of Q'. The image rejection is infinite in the ideal case. However, in real implementations the achievable amount of image rejection is limited by mismatches in circuit elements and the accuracy of 90 degrees rotation operations.

Figure 3:
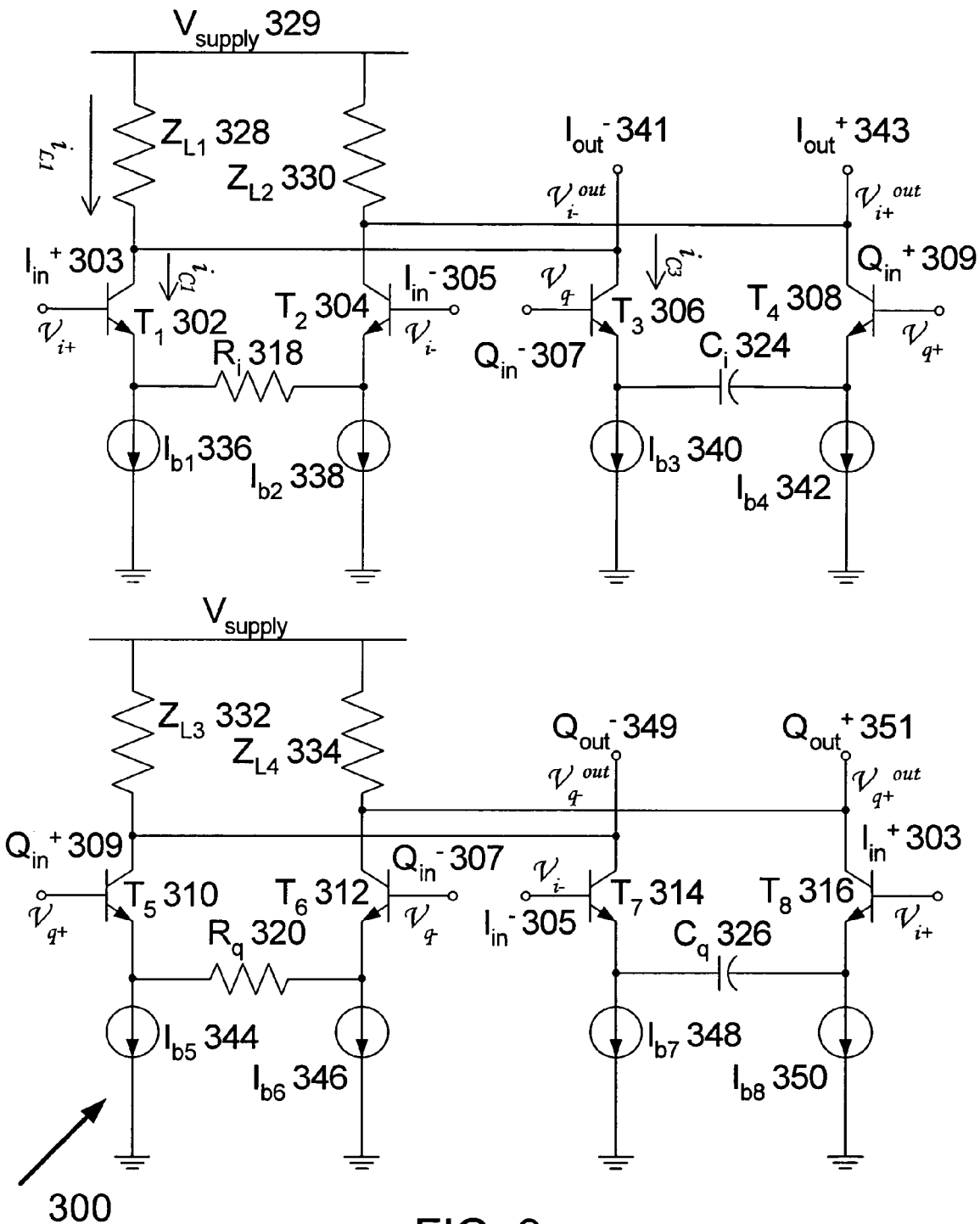
FIG. 3 illustrates a circuit diagram of an active polyphase filter in accordance with an embodiment of the present invention.

In accordance with a preferred embodiment of the present invention, FIG. 3 shows a quadrature filter circuit 300 that includes high-speed amplifiers with phase operations. Cascoded differential amplifiers T1 302, T2 304 and T8 316, T7 314 receive inputs $I_{in}^+$ 303 and $I_{in}^-$ 305, respectively. Cascoded differential amplifiers T5 310, T6 312 and T4 308, T3 306 receive inputs $Q_{in}^+$ 309 and $Q_{in}^-$ 307, respectively. Resistor Ri 318 is coupled between the current legs of the differential amplifier T1 302, T2 304 and specifically between emitter T1 302 and emitter T2 304. Resistor Rq 320 is coupled between the current legs of the differential amplifier T5 310 and T6 312 and specifically between emitter T5 310 and emitter T6 312. Capacitor Ci 324 is coupled between the current legs of differential amplifier T3 306 and T4 308 and specifically between emitter T3 306 and emitter T4 308. Capacitor Cq 326 is coupled between the current legs of differential amplifier T7 314 and T8 316 and specifically between emitter T7 314 and emitter T8 316.

Load resistance $Z_{L1}$ 328 has one end coupled to Vsupply 329 and the other end coupled to collector T1 302 and collector T3 306. The node of collector T3 306 also provides output $I_{out}^-$ 341. Load resistance $Z_{L2}$ 330 has one end coupled to Vsupply 329 and the other end coupled to collector T2 304 and collector T4 308. The node of collector T4 308 also provides output $I_{out}^+$ 343. Load resistance $Z_{L3}$ 332 has one end coupled to Vsupply 329 and the other end coupled to collector T5 310 and collector T7 314. The node of collector T7 314 also provides output $Q_{out}^-$ 349. Load resistance $Z_{L4}$ 334 has one end coupled to Vsupply 329 and the other end coupled to collector T6 312 and collector T8 316. The node of collector T8 316 also provides output $Q_{out}^+$ 351. Current sources Ib1 through Ib8 provide substantially equal currents. Current sources Ib1 336 and Ib2 338 are coupled to emitters T1 302 and T2 304, respectively. Current sources Ib3 340 and Ib4 342 are coupled to emitters T3 306 and T4 308, respectively. Current sources Ib5 344 and Ib6 346 are coupled to emitters T5 310 and T6 312, respectively. Current sources Ib7 348 and Ib8 350 are coupled to emitters T7 314 and T8 316, respectively.

Referring to cascoded differential amplifier T1 302, T2 304 with Ri 318 between the legs of the differential amplifier, inputs signals are passed to the loads $Z_{L1}$ 328 and $Z_{L2}$ 330 with a phase shift of 90° through Ci 324. Similarly, cascoded differential amplifier T5 310, T6 312 with Rq 320 between the legs of the differential amplifier, inputs signals are passed to the loads $Z_{L3}$ 332 and $Z_{L4}$ 334 with a phase shift of 90° through Cq 326. The cascoded differential amplifiers include active devices T1 302 through T8 316. As input signals are received at the inputs of the cascaded differential amplifiers, a gain is realized at the output of the quadrature filter circuit 300.

Although the quadrature filter circuit 300 is shown with bi-polar transistors as active devices, those skilled in the art will realize that MOS (metal oxide silicon) or other similar transistors may be substituted. The transistors have similar properties including similar transconductance for optimal operation of the quadrature filter circuit 300.

If bipolar junction transistors are used as the active devices, the operation can be described by the following equations at relatively low operating frequency:

$$i_{C1} = \frac{g_{m,C1} \cdot Z_{L1}}{1 + g_{m,C1} \cdot R_i/2} \frac{(v_{i+} - v_{i-})}{2}$$

$$i_{C3} = -\frac{g_{m,C3} \cdot Z_{L1}}{1 + g_{m,C3}/j\omega 2C_i} \frac{(v_{q+} - v_{q-})}{2}$$

$$i_{L1} = i_{C1} + i_{C3}$$

Let all bias currents $I_{b1} \sim I_{b8}$ are equal, and $R_i = R_q$, $C_i = C_q$, $j\omega_0 C_i R_i = 1$. Assume $g_{m,C1} \cdot R_i \gg 1$ $$v_{i-}^{out} = -i_{L1} \cdot Z_{L1} = -\frac{Z_{L1}}{R_i}\left[(v_{i+} - v_{i-}) + j\frac{\omega}{\omega_0} \cdot (v_{q+} - v_{q-})\right]$$

So $$(v_{i+}^{out} - v_{i-}^{out}) = i_{L1} \cdot Z_{L1} = \frac{2Z_{L1}}{R_i}\left[(v_{i+} - v_{i-}) + j\frac{\omega}{\omega_0} \cdot (v_{q+} - v_{q-})\right]$$

Similarly, quadrature output can be derived $$(v_{q+}^{out} - v_{q-}^{out}) = -i_{L1} \cdot Z_{L1} = \frac{2Z_{L1}}{R_i}\left[(v_{q+} - v_{q-}) - j\frac{\omega}{\omega_0} \cdot (v_{i+} - v_{i-})\right]$$

Image rejection $$IR_{out} = \frac{(v_{i+}^{out} - v_{i-}^{out}) + j \cdot (v_{q+}^{out} - v_{q-}^{out})}{(v_{i+}^{out} - v_{i-}^{out}) - j \cdot (v_{q+}^{out} - v_{q-}^{out})} =$$

$$\frac{\left(1 + \frac{\omega}{\omega_0}\right)((v_{i+} - v_{i-}) + j \cdot (v_{qi+} - v_{q-}))}{\left(1 - \frac{\omega}{\omega_0}\right)((v_{i+} - v_{i-}) - j \cdot (v_{qi+} - v_{q-}))} = \frac{\left(1 + \frac{\omega}{\omega_0}\right)}{\left(1 - \frac{\omega}{\omega_0}\right)} \cdot IR_{in}$$

At $\omega = \omega_0$, IR goes to infinity if there is no device mismatch, $g_{m,C1} \cdot R_i \gg 1$, and $\omega$ is low enough. In reality, these factors will cause an upper limit in how much image rejection one can get from this circuit.

While the foregoing detailed description has described several embodiments of the present invention, it is to be understood that the above description is illustrative only and not limiting of the disclosed invention. Obviously, many modifications and variations will be apparent to those skilled in the art without departing from the spirit of the invention.

We claim:

1. A polyphase filter comprising:
   a first and second cascoded differential amplifiers configured to receive a first and second differential signals, the first cascoded differential amplifier having a first resistor coupled between current legs of the first cascoded differential amplifier and the second cascoded differential amplifier having a first capacitor coupled between current legs of the second cascoded differential amplifier; and
   a third and fourth cascoded differential amplifiers configured to receive said first and said second differential signals, the third cascoded differential amplifier having a second resistor coupled between current legs of the third cascoded differential amplifier and the fourth cascoded differential amplifier having a second capacitor coupled between current legs of the fourth cascoded differential amplifier;
   wherein the first and second cascoded differential amplifiers are configured to provide a first differential output in response to the first and second differential signals and the third and fourth cascoded differential amplifiers are configured to provide a second differential output in response to the first and second differential signals.

2. The polyphase filter according to claim 1, wherein the first resistor is substantially equal to the second resistor and the first capacitor is substantially equal to the second capacitor.

3. The polyphase filter according to claim 1, wherein the first cascoded differential amplifier includes a first pair of load resistances coupled to a supply voltage.

4. The polyphase filter according to claim 3, wherein the third cascoded differential amplifier includes a second pair of load resistances coupled to a supply voltage.

5. The polyphase filter according to claim 1, wherein the first differential signals include inputs $I_{in}^+$, and $I_{in}^-$, and the second differential signals include $Q_{in}^+$, and $Q_{in}^-$.

6. The polyphase filter according to claim 1, wherein each of the cascoded differential amplifiers includes a pair of current sources having substantially similar current flow.

7. The polyphase filter according to claim 1, wherein each of the cascoded differential amplifiers includes transistors having substantially similar properties.

8. The polyphase filter according to claim 7, wherein the transistors include MOS devices having similar transconductance.

9. The polyphase filter according to claim 7, where the transistors include bipolar junction devices having substantially similar gm properties.

10. A polyphase filter comprising:
    a first resistor having a first end coupled to a supply voltage and a second end coupled to a first end of a first transistor;
    a second end of the first transistor configured to receive a first input and a third end of the first transistor coupled to a first current source;
    a second resistor having a first end coupled to the supply voltage and a second end coupled to a first end of a second transistor;
    a second end of the second transistor configured to receive a second input and a third end of the second transistor coupled to a second current source;
    a third resistor coupled between the first current source and the second current source;
    a third transistor having a first end coupled to the first end of the first transistor, a second end configured to receive a third input, and a third end coupled to a third current source;
    a fourth transistor having a first end coupled to the first end of the second transistor, a second end configured to receive a fourth input, and a third end coupled to a fourth current source;
    a first capacitor coupled between the third current source and the fourth current source;
    a fourth resistor having a first end coupled to a supply voltage and a second end coupled to a first end of a fifth transistors;

a second end of the fifth transistor coupled to receive the fourth input and a third end of the fifth transistor coupled to a fifth current source;

a fifth resistor having a first end coupled to a supply voltage and a second end coupled to a first end of a sixth transistors;

a second end of the sixth transistor coupled to receive the third input and a third end of the sixth transistor coupled to a sixth current source;

a sixth resistor coupled between the fifth current source and the sixth current source;

a seventh transistor having a first end coupled to the first end of the fifth transistor, a second end coupled to receive the second input, and a third end coupled to a seventh current source;

an eighth transistor having a first end coupled to the first end of the sixth transistor, a second end coupled to receive the first input, and a third end coupled to an eighth current source; and a second capacitor coupled between the seventh current source and the eighth current source.

11. The polyphase filter according to claim 10, wherein the first resistor is substantially equal to the second resistor and the first capacitor is substantially equal to the second capacitor.

12. The polyphase filter according to claim 10, wherein the transistors are substantially bipolor junction transistors.

13. The polyphase filter according to claim 10, wherein the transistors are substantially metal oxide silicon transistors.

14. The polyphase filter according to claim 10, wherein the first resistor, the second resistor, the third resistor, and the fourth resistor are substantially equal.

15. The polyphase filter according to claim 10, wherein the first current source, the second current source, the fifth current source, and the sixth current source have substantially similar current flow.

16. The polyphase filter according to claim 10, wherein each of the transistors include transistors having substantially similar properties.

* * * * *